United States Patent
Driendl et al.

[11] Patent Number: 6,141,672
[45] Date of Patent: Oct. 31, 2000

[54] TUNABLE DIGITAL FILTER ARRANGEMENT

[75] Inventors: Dieter Driendl, Deggenhausertal; Erwin Kessler, Saalgau; Kurt Kleiner, Messkirch; Wolfgang Schulter, Meersburg, all of Germany

[73] Assignee: TEMIC TELEFUNKEN microelectronic GmbH, Heilbronn, Germany

[21] Appl. No.: 09/136,187

[22] Filed: Aug. 19, 1998

[30] Foreign Application Priority Data

Sep. 2, 1997 [DE] Germany .................. 197 38 226

[51] Int. Cl.$^7$ ................................................. G06F 17/10
[52] U.S. Cl. ................................................... 708/320
[58] Field of Search ............................. 708/300, 319–320

[56] References Cited

U.S. PATENT DOCUMENTS

| | | | |
|---|---|---|---|
| 3,777,130 | 12/1973 | Croisier et al. | 708/320 |
| 4,521,867 | 6/1985 | Kasuga | 708/320 |
| 5,282,023 | 1/1994 | Scarpa | 708/320 |
| 5,381,358 | 1/1995 | Sakamoto | 708/320 |
| 5,687,101 | 11/1997 | Lee | 708/320 |
| 5,740,091 | 4/1998 | Fukui et al. | 708/320 |
| 5,798,954 | 8/1998 | Ishibata | 708/320 |

FOREIGN PATENT DOCUMENTS

96/31001  10/1996  WIPO .

OTHER PUBLICATIONS

Arild Lacoix; Digitale Filter, Eine Einführung in zeitdiskrete Signale und Systeme, 2. Auflage 1985, R. Oldenbourg München, Wien, pp. 70 to 77.

U. Tietze et al., Halbleiter–Schaltungstechnik, Zehnte Auflage 1993, Springer Verlag, pp. 791 to 833.

*Primary Examiner*—Tan V. Mai
*Attorney, Agent, or Firm*—W. F. Fasse; W. G. Fasse

[57] ABSTRACT

A tunable digital filter arrangement realizes the difference equation $$y[n]=\alpha \cdot (x[n] \pm x[n-1])+(1-2\alpha)\cdot y[n-1]$$

and in which the limiting frequency can be tuned linearly by means of only one tuning parameter $\alpha$. The tuning range is limited solely by the sampling rate and bit width of the registers and can also accept in particular very low frequencies. The filter arrangement can therefore also be used in particular for prefiltering sampled and digitized measured values of the motor current for load-dependent motor control in the extremely slow speed range. By selecting "+" as the operator "±", a low-pass characteristic results; selecting "−" as the operator results in a high-pass filter. It is possible to cascade several low-pass and/or high-pass filters.

5 Claims, 2 Drawing Sheets

TUNABLE DIGITAL FILTER ARRANGEMENT

BACKGROUND OF THE INVENTION

The invention relates to a tunable digital filter arrangement as described in the chapter "Digital filters" on page 791 et seq. in the book by Tietze/Schenk entitled "Halbleiter-Schaltungstechnik" (Semiconductor Circuitry), 10th printing, Springer Verlag 1993.

The practical implementation of digital filter arrangements is described at length by Lacroix, Arild in: "Digitale Filter : eine Einführung in zeitdiskrete Signale und Systeme" (Digital filters: An introduction to discrete-time signals and systems), 2nd printing 1985, pages 70 to 77, and is also to be found, for example, in WO 96/31001.

It was a disadvantage of the previously known digital filter arrangements that they were either not tunable at all or only by means of at least two parameters which were programmed and specified in a lookup table because the numerical relationships between the parameters are very complex and their calculation is too costly. Such two-parameter tunable filters, however, require a lookup table and an appropriate access control.

SUMMARY OF THE INVENTION

The invention relates to a tunable digital filter arrangement which is extremely easy to realize.

This is achieved by the filter arrangement being tunable by means of only one parameter and being based on simple numerical steps which can be realized extremely easily in terms of hardware. The predetermined difference equation, for instance, is based only on addition, time delay by a time unit, and multiplication with the parameter, all operations which are known to be easy to realize. In order to tune the filter, it merely requires the parameter to be modified in proportion to the desired change in frequency. There is no complicated mathematical calculation of filter constants. The tuning range of such a filter arrangement can be varied accordingly and expanded by appropriately selecting the sampling frequency and the bit width of the registers and multipliers. In particular very low limiting frequencies are also possible which cannot be realized in analog designs.

Furthermore, it is especially advantageous that the denominator with $(1-2\alpha)$ is real for all $\alpha$ that satisfy the condition $0<\alpha<1$ and that consequently the filter arrangement remains stable and displays no oscillation phenomena.

By suitably selecting the operator, the filter arrangement will display a low-pass or a high-pass characteristic.

By means of series or cascade circuitry in this filter arrangement, it is possible to obtain filter arrangements of a higher order or with bandpass characteristics.

A tunable digital filter arrangement of this kind can be used preferably for low-pass filtering of a sampled digitized motor current in a method for the load-dependent control of a motor.

In order, for example, to distinguish between external disturbances, or current fluctuations caused by double commutations, it is necessary to low-pass filter the motor current accordingly. Since the motor speed can vary between very wide limits, however, a very wide-banded tunable filter arrangement is required, as that proposed in the invention. Since the speed can also vary in particular in the range of just a few Hertz when the load torque at the motor increases powerfully, the tunable filter arrangement must also be tunable in this extremely low frequency range. This cannot be achieved with conventional analog filters. The filter arrangement according to the invention can also reach the required very low limiting frequencies. Additionally, since in motor controls there is usually a direct linear relationship between motor speed and required limiting frequency, application of the single-parameter filter arrangement proves to be particularly advantageous.

DESCRIPTION OF THE PREFERRED EMBODIMENTS

Figure 1:
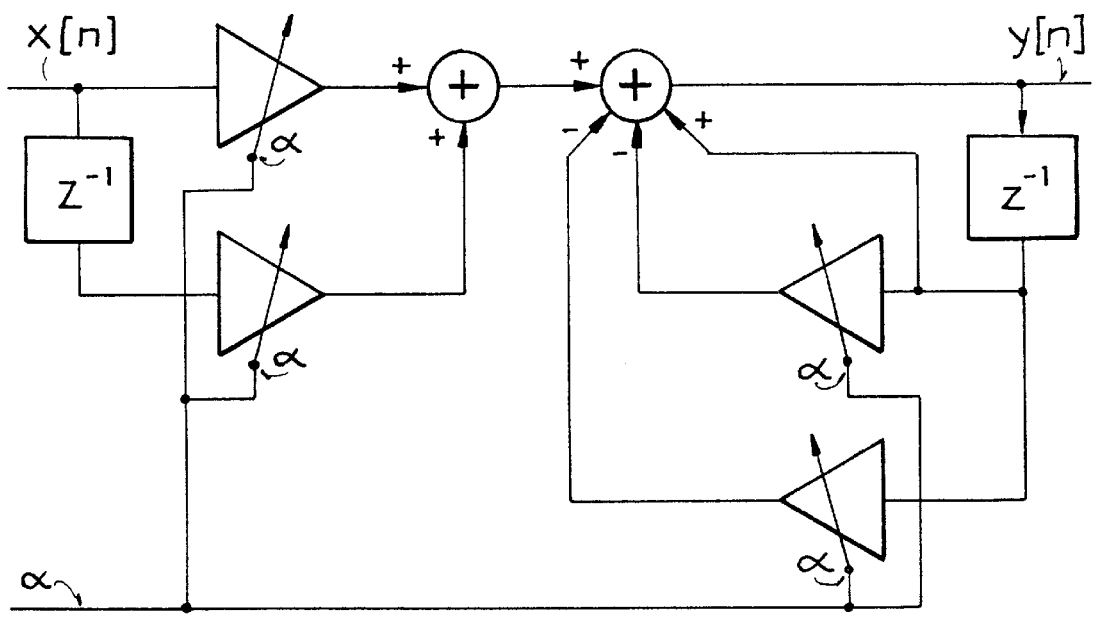
FIG. 1 shows a block schematic layout of the filter arrangement.

The invention will now be explained with reference to an embodiment example and the figures. The block schematic layout of the filter arrangement displayed in FIG. 1 shows a low-pass filter of the 1st order as embodiment example. Replacing the operator "±" by a "−" in place of the "+", as realised in FIG. 1 in the path $x[n] \cdot z^{-1}$ creates a high pass and by cascading several filter elements of the low-pass and/or high-pass type a bandpass filter or a higher-order filter would be created.

At the input to the filter arrangement there are the sampled digitized measured values of the motor current, where $x[n]$ stands for the nth input value. The nth output value $y[n]$ is available accordingly at the output. This results from the difference equation $$y[n]=\alpha \cdot (x[n]\pm x[n-1])+(1-2\alpha) \cdot y[n-1]$$

whereby $\alpha$ is a gain or damping factor.

For this purpose, the input is connected on the one hand with a first amplifier C1 and on the other hand with a first time-delay element T1. The input signal $x[n]$ amplified by C1 by the gain factor $\alpha$ (or damped, since $0<\alpha<1$) is added in a first summing element S1 to the input signal $x[n-1]$, amplified by $\alpha$ in a second amplifier C2 and stored in T1 for one time cycle.

The result of S1 is fed to a second summing element S2 where it is added to the output signal $y[n-1]$ tored in a time-delay element T2 for one time cycle and the output signal $y[n-1]$ amplified by $\alpha$ in the amplifiers C3 and C4 and delayed in T2 is subtracted twice.

At the output of S2, the output signal $y[n]$ is then available which is also stored by the time-delay element T2 for one time cycle thereby storing the next sampling value. All amplifiers C1 to C4 have the same gain factor $\alpha$ (or damping factor, since $0<\alpha<1$). The amplifiers C1 to C4 can be both analog amplifiers and digital multipliers. The bit width of the time-delay elements T1 and T2, the summing elements S1 and S2, and, where applicable, the amplifiers C1 to C4 designed as digital multipliers results in known fashion from the bit width of the sampled digitized input signal. In accordance with the sampling theorem, the sampling frequency must be chosen to be at least twice as high as the highest speed that is still permissible. On the other hand, the bit width must be chosen such that, at the lowest speed that is still permissible, the least-significant bit can at least still be reached.

Figure 2:
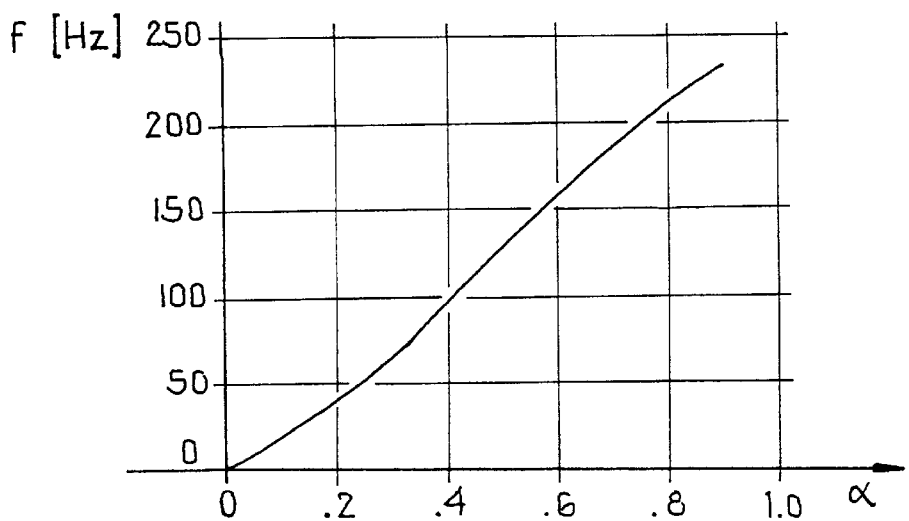
FIG. 2 shows the limiting frequency of the filter arrangement related to the tuning parameter $\alpha$.

FIG. 2 shows the sketched curve for the limiting frequency of the filter arrangement in relation to the tuning parameter α for a low-pass filter at a sampling frequency of 500 Hz. For signals with a width of 8 bits, this results in a practical lower limit of the tuning range of 500 Hz/$2^8$ or approximately 2 Hz. Because of the digitization of α in the amplifiers C1 to C4 which are of the digital multiplier type, the sketched linear curve in FIG. 2 is naturally not continuous but only in steps of $½^8$. In general, however, FIG. 2 again shows clearly that the tuning parameter α allows a very wide tuning range to be set and also, in particular, very low limiting frequencies.

Figure 3:
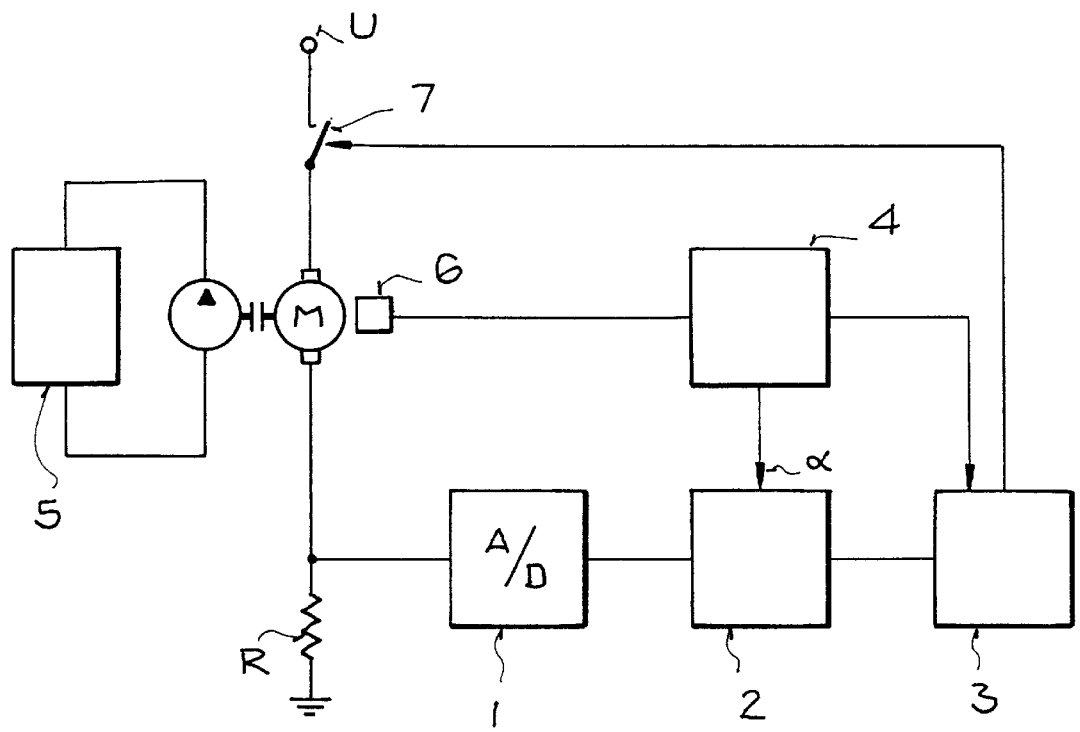
FIG. 3 shows a block diagram of an arrangement for load-dependent motor control, where the sampled digitized measured values of the motor current are filtered appropriately with the filter arrangement.

As shown in the block diagram of FIG. 3, the shunt resistor R measures the motor current $I_M$ from the motor M. This current is first of all sampled and digitized in an A/D converter 1. The digitized motor current value is first taken from the output of the A/D converter 1 to the filter arrangement according to the invention, shown here as block 2, where it is low-pass filtered. The motor current value which is thus free of disturbances is then fed to the downline evaluation unit 3 and the motor M is controlled via the control element 7, shown here in the simplest case as a switch. A speed measuring circuit 4 establishes the actual speed, for example by means of a Hall sensor 6. The speed measurement circuit 4 has a coupling to the filter arrangement 2 with which the speed measurement circuit 4 corrects the tuning parameter α for the amplifier in accordance with the measured actual speed thereby filtering out disturbances related to the speed. The evaluation unit 3 establishes a load-dependent magnitude from the value of the motor current and from the speed and controls the motor M accordingly via control element 7. In the embodiment example shown, a pump P for a hydraulic power steering system 5 is driven by the motor M. In the non-operated state (no steering movement) the pump P is typically run at a low speed in order to save energy. When steering movements occur, however, the pump should be controlled to a higher speed/delivery as fast as possible (approx. 30–50 ms). When a steering movement occurs, a torsion valve establishes a hydraulic link to a power steering cylinder and the motor current $I_M$ rises by a certain amount due to the rise in pressure. When using the motor current $I_M$ as a means of detection, an increase in load at the pump P on operating the steering system can be detected without a pressure sensor.

What is claimed is:

1. Tunable digital filter arrangement, comprising at least one filter element that is tuned by means of precisely one tuning parameter (α) and realizes the transmission function $$H(z) = \alpha \cdot \frac{1 \pm z^{-1}}{1 + (2\alpha - 1) \cdot z^{-1}}$$

or the associated difference equation $$y[n] = \alpha \cdot (x[n] \pm x[n-1]) + (1-2\alpha) \cdot y[n-1]$$

or an equation that can be derived from this by mathematical conversion, where x[n] is the nth input value and y[n] is the nth output value and n is the sampling step sequence of the digital filter.

2. Tunable digital filter arrangement in accordance with claim 1, wherein a low-pass filter element is created by replacing the operator "±" by a "+" and a high-pass filter element is created by replacing the operator "±" by a "−".

3. Tunable digital filter arrangement in accordance with claim 2, comprising at least a first filter element of the high-pass type and at least a second filter element of the low-pass type cascaded with each other to form a tunable bandpass or a tunable band-stop.

4. Method of using the tunable filter arrangement in accordance with claim 2 for the low-pass filtering of sampled digitized measured values of a motor current for load-dependent motor control, where the tuning parameter α is controlled in relationship to the previously measured motor speed.

5. Method of using the tunable filter arrangement in accordance with claim 2 for the low-pass filtering of sampled digitized measured values of a motor current for load-dependent motor control, where the tuning parameter α is controlled in relationship to the previously measured motor current and motor voltage.

* * * * *

UNITED STATES PATENT AND TRADEMARK OFFICE
CERTIFICATE OF CORRECTION

PATENT NO. : 6,141,672

DATED : Oct. 31, 2000

INVENTOR(S) : Driendl et al.

It is certified that error appears in the above-identified patent and that said Letters Patent is hereby corrected as shown below:

On the title page in [57], line 2, replace "Saalgau' by --Saulgau--;

under "OTHER PUBLICATIONS", line 1, replace "Lacoix" by --Lacroix--;

Col. 2, line 27, before "cascading" delete --by--;

Col. 2, line 28, after "type" insert --creates-;

Col. 2, lines 28+29, after "higher-order filter" delete --would be created--;

Col. 2, line 48, replace "tored" by --stored--.

Signed and Sealed this

Eighth Day of May, 2001

Attest:

NICHOLAS P. GODICI

Attesting Officer

Acting Director of the United States Patent and Trademark Office